United States Patent
Kang

(10) Patent No.: US 10,234,482 B2
(45) Date of Patent: Mar. 19, 2019

(54) PROBE CARD WITH A NEEDLE AND A TESTING APPARATUS INCLUDING THE SAME

(71) Applicant: SAMSUNG ELECTRONICS CO., LTD., Suwon-si, Gyeonggi-do (KR)

(72) Inventor: Sangboo Kang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 49 days.

(21) Appl. No.: 15/270,870

(22) Filed: Sep. 20, 2016

(65) Prior Publication Data

US 2017/0153275 A1    Jun. 1, 2017

(30) Foreign Application Priority Data

Nov. 30, 2015    (KR) ........................ 10-2015-0168659

(51) Int. Cl.
     *G01R 1/067*      (2006.01)
     *G01R 1/073*      (2006.01)
     *G01R 31/28*      (2006.01)

(52) U.S. Cl.
     CPC ..... *G01R 1/07342* (2013.01); *G01R 1/06733* (2013.01); *G01R 1/07371* (2013.01); *G01R 31/2831* (2013.01); *G01R 31/2889* (2013.01)

(58) Field of Classification Search
     CPC ............ G01R 1/06711; G01R 1/06738; G01R 1/0675
     See application file for complete search history.

(56) References Cited

U.S. PATENT DOCUMENTS

| 5,045,780 | A | * | 9/1991 | Swart | ................. | G01R 1/06722 324/72.5 |
|---|---|---|---|---|---|---|
| 7,349,223 | B2 | | 3/2008 | Haemer et al. | | |
| 2004/0223309 | A1 | | 11/2004 | Haemer et al. | | |
| 2007/0057683 | A1 | * | 3/2007 | Abe | .................. | G01R 31/2891 324/750.16 |
| 2012/0068726 | A1 | * | 3/2012 | Hayashizaki | ...... | G01R 1/06738 324/755.01 |
| 2012/0122355 | A1 | * | 5/2012 | Hemmi | .............. | G01R 1/06722 439/816 |
| 2013/0099813 | A1 | | 4/2013 | Hoshino et al. | | |

(Continued)

FOREIGN PATENT DOCUMENTS

| JP | 2006308312 | 11/2006 |
|---|---|---|
| JP | 2009204491 | 9/2009 |
| KR | 1020020091665 | 12/2002 |

(Continued)

*Primary Examiner* — Noam Reisner
(74) *Attorney, Agent, or Firm* — F. Chau & Associates, LLC

(57) ABSTRACT

A probe card includes a probe board and a needle disposed on the probe board, the needle including a needle tip. The needle tip includes a bottom surface having a long axis and a short axis that crosses the long axis. The needle tip includes a top surface being spaced apart from the bottom surface, wherein the top surface has a long axis and a short axis that crosses the long axis, and wherein the long axis of the bottom surface and the long axis of the top surface extend in different directions. The needle tip includes a side surface connecting the bottom surface with the top surface, wherein the side surface is twisted between the top and bottom surfaces.

19 Claims, 11 Drawing Sheets

(56) References Cited

U.S. PATENT DOCUMENTS

2015/0168455 A1* 6/2015 Anraku .................. C22C 5/04
                                                324/754.03
2016/0018440 A1* 1/2016 Chung ............... G01R 1/06722
                                                324/755.05

FOREIGN PATENT DOCUMENTS

| KR | 10-1168147 | 7/2012 |
| KR | 10-1465591 | 11/2014 |
| KR | 10-1544320 | 8/2015 |

* cited by examiner

PROBE CARD WITH A NEEDLE AND A TESTING APPARATUS INCLUDING THE SAME

CROSS-REFERENCE TO RELATED APPLICATIONS

This U.S. non-provisional patent application claims priority under 35 U.S.C. § 119 to Korean Patent Application No. 10-2015-0168659, filed on Nov. 30, 2015, in the Korean Intellectual Property Office, the disclosure of which is incorporated by reference herein in its entirety.

TECHNICAL FIELD

The present disclosure relates to a testing apparatus, and in particular, to a probe card with a needle and a testing apparatus including the same.

DISCUSSION OF THE RELATED ART

Various processes may be performed to fabricate a semiconductor device. A testing process may be performed to evaluate the reliability of a fabricated semiconductor device. A testing apparatus may include a probe card configured to input or output electrical signals to or from the fabricated semiconductor device. The probe card may be electrically connected to a wafer of the fabricated semiconductor device. However, the probe card may need maintenance after being repeatedly used.

SUMMARY

According to an exemplary embodiment of the inventive concept, a probe card may be made more reliable.

According to an exemplary embodiment of the inventive concept, a testing apparatus may include a plurality of needle tips, and a height of each the plurality of needle tips can be monitored.

According to an exemplary embodiment of the inventive concept, a probe card includes a probe board and a needle disposed on the probe board. The needle includes a needle tip. The needle tip includes a bottom surface having a long axis and a short axis that crosses the long axis. The needle tip includes a top surface being spaced apart from the bottom surface, wherein the top surface has a long axis and a short axis that crosses the long axis, and wherein the long axis of the bottom surface and the long axis of the top surface extend in different directions. The needle tip includes a side surface connecting the bottom surface with the top surface, wherein the side surface is twisted between the top and bottom surfaces.

According to an exemplary embodiment of the inventive concept, a testing apparatus includes a wafer supporting part configured to receive a wafer thereon, a probe card configured to provide electrical paths to the wafer, and a tester configured to electrically test the wafer through the probe card. The probe card includes a probe board and a needle disposed on the probe board. The needle includes a needle tip. The needle tip includes a bottom surface including a first axis and a second axis that crosses the first axis. The needle tip includes a top surface being spaced apart from the bottom surface, wherein the top surface includes a first axis and a second axis that crosses the first axis, and wherein the first axis of the bottom surface and the first axis of the top surface extend in different directions. The needle tip includes a side surface connecting the bottom surface with the top surface, wherein the side surface is twisted.

According to an exemplary embodiment of the inventive concept, a probe card includes a probe board and a needle disposed on the probe board. The needle includes a needle tip. The needle tip extends in a first direction and the needle tip is twisted along the first direction.

BRIEF DESCRIPTION OF THE DRAWINGS

The inventive concept will be described in detail with reference to the accompanying drawings, in which.

Figure 1:
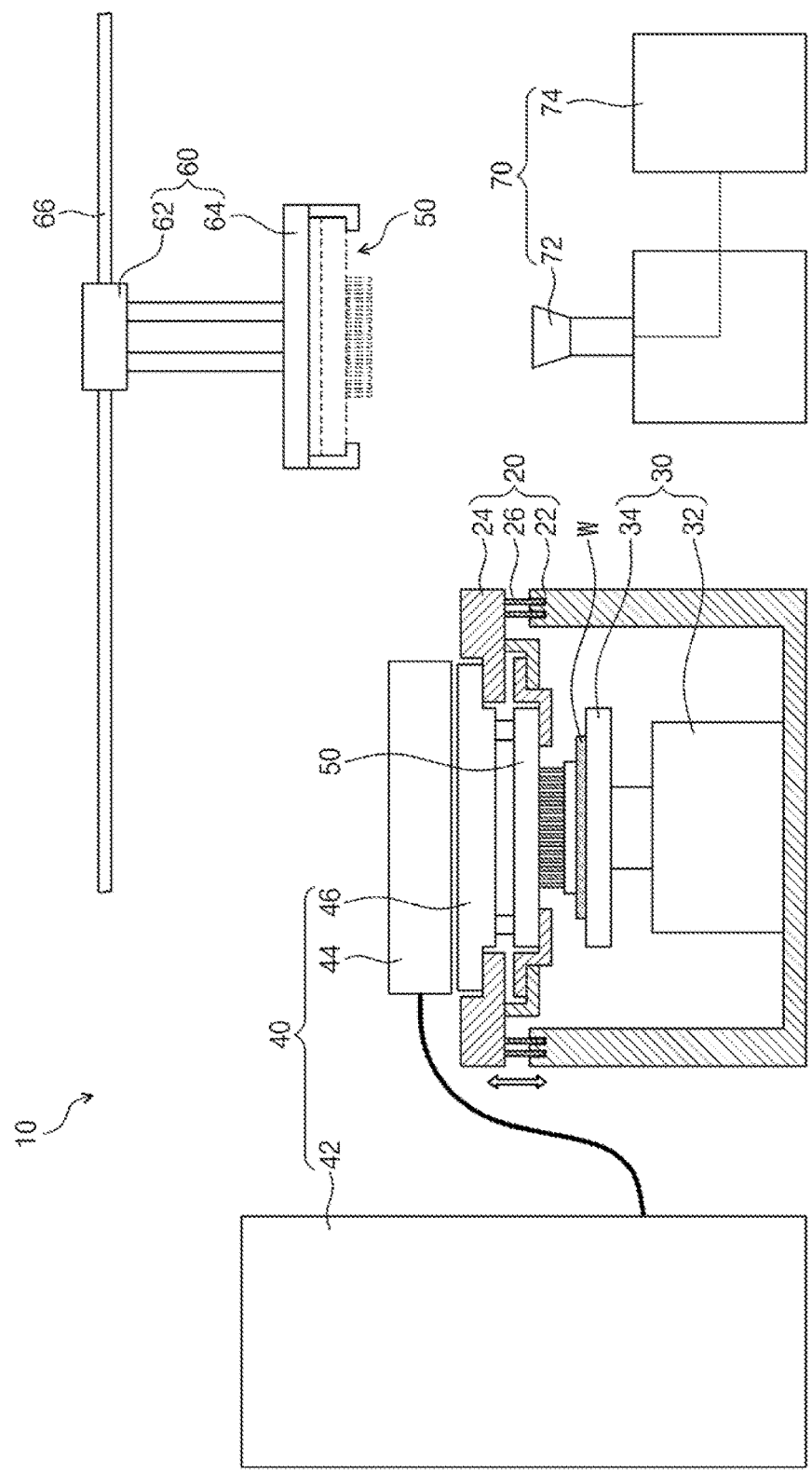
FIG. 1 is a diagram illustrating a testing apparatus according to an exemplary embodiment of the inventive concept.

The elements illustrated in the drawings might not be drawn to scale. For example, the relative thicknesses and positioning of the layers, regions and/or structural elements displayed in the drawings may be reduced or exaggerated for clarity.

DETAILED DESCRIPTION OF THE EMBODIMENTS

Exemplary embodiments of the inventive concept will now be described more fully hereinafter with reference to the accompanying drawings. The inventive concept, however, may be embodied in various different forms and should not be constructed as being limited to the exemplary embodiments thereof set forth herein.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element, or intervening elements may be present.

Similarly, it will be understood that when a layer, region or substrate is referred to as being "on" another layer, region or substrate, the layer, region or substrate can be directly on the other layer, region or substrate or intervening layers, regions or substrates may be present. The elements, layers, regions or substrates illustrated in the drawings may be modified according to manufacturing techniques and/or allowable errors. Exemplary embodiments of the inventive concept are not limited to the specific shapes illustrated in the exemplary views and modifications may be made thereto.

Like reference numerals may refer to like elements throughout the specification.

FIG. 1 is a diagram illustrating a testing apparatus 10 according to an exemplary embodiment of the inventive concept.

Referring to FIG. 1, the testing apparatus 10 may include an electrical die sorting (EDS) testing equipment. In an exemplary embodiment of the inventive concept, the testing apparatus 10 may include a prober 20, a wafer supporting part 30, a testing part 40, a probe card 50, a card transferring part 60, and a card monitoring part 70. A wafer W may be disposed in the prober 20. The wafer supporting part 30 may be used to receive the wafer W in the prober 20. The wafer W may be disposed below the probe card 50 by the prober 20. The testing part 40 may be used to electrically test the wafer W. The testing part 40 may be connected to the wafer W through the probe card 50. The card transferring part 60 may be used to unload the probe card 50 from the prober 20. The card monitoring part 70 may be used to monitor a state of the probe card 50.

The prober 20 may be used to control a position of the probe card 50 relative to the wafer W. In an exemplary embodiment of the inventive concept, the prober 20 may include a lower housing 22, an upper housing 24, and a position adjusting unit 26. The lower housing 22 may contain the wafer supporting part 30. In an exemplary embodiment of the inventive concept, the lower housing 22 may be a wafer prober or may be configured to transfer the wafer W. The upper housing 24 may be provided on the lower housing 22. The upper housing 24 may be used to immobilize the probe card 50. The position adjusting unit 26 may be provided between the lower housing 22 and the upper housing 24. The position adjusting unit 26 may be provided on the upper housing 24. The position adjusting unit 26 may change a vertical position of the upper housing 24 relative to the lower housing 22. The position adjusting unit 26 may change a horizontal position of the upper housing 24. The position adjusting unit 26 may be used to change a position of the probe card 50 relative to the wafer W.

The wafer supporting part 30 may be disposed on an inner bottom surface of the lower housing 22. In an exemplary embodiment of the inventive concept, the wafer supporting part 30 may include a stage 32 and a chuck 34. The stage 32 may be disposed on the inner bottom surface of the lower housing 22. The chuck 34 may be disposed on the stage 32. The chuck 34 may be configured to fixedly hold the wafer W thereon. Furthermore, the chuck 34 may be configured to control a temperature of the wafer W. For example, the chuck 34 may be configured to heat the wafer W. The chuck 34 may heat the wafer W to a temperature of, for example, about 90° C. In addition, the chuck 34 may be configured to cool the wafer W. The chuck 34 may be configured to cool the wafer W to a temperature of, for example, about −20° C.

The testing part 40 may be disposed outside of the prober 20. In an exemplary embodiment of the inventive concept, the testing part 40 may include a tester 42, a tester head 44, and an interface 46. The tester 42 may be configured to electrically test the wafer W. The tester head 44 may be configured to connect the tester 42 to the interface 46. The tester head 44 may be provided on the upper housing 24. The interface 46 may be used to connect the tester head 44 to the probe card 50. The interface 46 may be disposed in the upper housing 24.

The probe card 50 may be disposed in the lower housing 22 and the upper housing 24. The probe card 50 may be disposed between the wafer W and the interface 46. The probe card 50 may be used to electrically connect the wafer W to the interface 46.

The card transferring part 60 may be used to transfer the probe card 50. In an exemplary embodiment of the inventive concept, the card transferring part 60 may be used to transfer the wafer W. In an exemplary embodiment of the inventive concept, the card transferring part 60 may be used to transfer the tester head 44 and the interface 46. The tester head 44 and the interface 46 may be transferred before the probe card 50 is transferred. For example, the card transferring part 60 may include an over-head transfer (OHT). The card transferring part 60 may be moved along a rail 66. In an exemplary embodiment of the inventive concept, the card transferring part 60 may include a transferring unit 62 and a hoisting unit 64. The transferring unit 62 may be used to transfer the hoisting unit 64 along the rail 66. The transferring unit 62 may be configured to change a vertical position of the hoisting unit 64. The hoisting unit 64 may be configured to hold the probe card 50. In an exemplary embodiment of the inventive concept, the hoisting unit 64 may be configured to hold the tester head 44, the interface 46, and/or the wafer W.

The card monitoring part 70 may be disposed outside of the lower housing 22 and the upper housing 24. In an exemplary embodiment of the inventive concept, the card monitoring part 70 may be disposed inside the lower housing 22 and the upper housing 24. In an exemplary embodiment of the inventive concept, the card monitoring part 70 may include a sensor 72 and a control unit 74. The sensor 72 may be used to detect the probe card 50. For example, the sensor 72 may include an image sensor. The probe card 50 may be disposed below the card transferring part 60. The sensor 72 may be disposed below the probe card 50. The control unit 74 may be connected to the sensor 72. The sensor 72 of the control unit 74 may be used to acquire an image of the probe card 50. The control unit 74 may be configured to analyze the acquired image and determine a state of the probe card 50.

Figure 2:
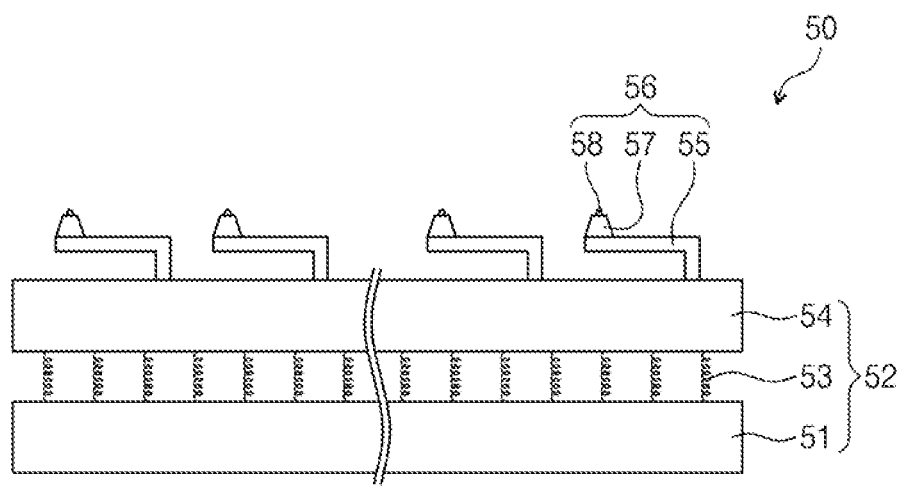
FIG. 2 is a cross-sectional view illustrating a probe card of the testing apparatus of FIG. 1, according to an exemplary embodiment of the inventive concept.

FIG. 2 is a cross-sectional view illustrating the probe card 50 of the testing apparatus 10 of FIG. 1, according to an exemplary embodiment of the inventive concept.

Referring to FIG. 2, the probe card 50 may include a probe board 52 and probe needles 56. The probe needles 56 may be regularly arranged on the probe board 52. For example, the probe needles 56 may be disposed at equal distances from each other.

The probe board 52 may be configured to immobilize the probe needles 56. In an exemplary embodiment of the inventive concept, the probe board 52 may include a printed circuit board 51, interposers 53, and an insulation board 54. The printed circuit board 51 may be configured to immobilize the interposers 53. The printed circuit board 51 may include electronic devices for controlling detection signals of the probe needles 56. For example, the printed circuit board 51 may include a micro-processor, a memory, a transistor, a capacitor, a resistor, a diode, or conductive interconnection lines. The interposers 53 may be disposed between the printed circuit board 51 and the insulation board 54. The interposers 53 may be used to reduce weights of the insulation board 54 and the probe needles 56. For example, each of the interposers 53 may include a spring. The insulation board 54 may be disposed on the interposers 53. In addition, the insulation board 54 may be connected to the interposers 53. The insulation board 54 may be disposed to be parallel to the printed circuit board 51. The insulation board 54 may have the same area and/or the same size as the printed circuit board 51. The insulation board 54 may be configured to immobilize the probe needles 56. The insulation board 54 may, for example, be formed of ceramics.

The probe needles 56 may be electrically connected to the printed circuit board 51 through the insulation board 54 and the interposer 53. For example, the probe needles 56 may include a conductive micro electro mechanical system (MEMS). The probe needles 56 may be elastic. The probe needles 56 may include a nickel-chromium alloy. In an exemplary embodiment of the inventive concept, each of the probe needles 56 may include a needle body 55, a needle base 57, and a needle tip 58. The needle body 55 may be disposed on the insulation board 54. The needle base 57 may be disposed between the needle body 55 and the needle tip 58. The needle tip 58 may have an electrical conductivity that is higher than that of the needle base 57 and the needle body 55. The needle tip 58 may be connected to the printed circuit board 51 by conductive interconnection lines in the needle base 57 and the needle body 55.

Figure 3:
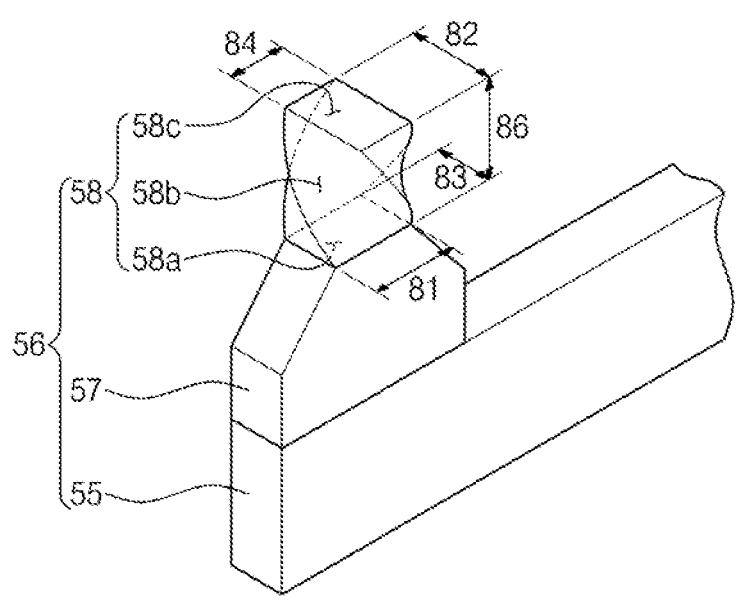
FIG. 3 is a perspective view illustrating a probe needle of the probe card of FIG. 2, according to an exemplary embodiment of the inventive concept.

FIG. 3 is a perspective view illustrating a probe needle 56 of the probe card 50 of FIG. 2, according to an exemplary embodiment of the inventive concept.

Referring to FIG. 3, the needle tip 58 may be twisted or wrung in a direction away from the needle base 57. For example, the needle tip 58 may have a twisted rectangular parallelepiped shape. Accordingly, the needle tip may extend in a twisted or wrung shape in the direction away from the needle base 57. The needle tip 58 may have a bottom surface 58a, side surfaces 58b, and a top surface 58c. Thus, the needle tip 58 may, for example, have a twisted rectangular parallelepiped shape that extends between the bottom surface 58a and the top surface 58c.

The bottom surface 58a may be in contact with the needle base 57. For example, the bottom surface 58a may have a rectangular shape. Alternatively, the bottom surface 58a may have a rhombus or a triangular shape. In an exemplary embodiment of the inventive concept, the bottom surface 58a may be disposed (e.g., extend) in a first longitudinal direction. For example, the bottom surface 58a may have a bottom long axis 81 and a bottom short axis 83. The bottom long axis 81 may be longer than the bottom short axis 83. The bottom long axis 81 may be longer by, for example, about 1.5 times the length of the bottom short axis 83.

Each of the side surfaces 58b may connect the bottom surface 58a with the top surface 58c. Each of the side surfaces 58b may have a twisted structure in a direction from the bottom surface 58a to the top surface 58c. Each of the side surfaces 58b may be twisted and may be shaped like the letter "S". For example, the twisted side surfaces 58b may have a height 86 of, for example, about 30 μm.

The top surface 58c may be disposed on the bottom surface 58a and the side surfaces 58b. In an exemplary embodiment of the inventive concept, the top surface 58c and the bottom surface 58a may have the same shape. For example, the top surface 58c may have a rectangular shape. Alternatively, the top surface 58c may have a different shape from that of the bottom surface 58a. The top surface 58c may have a rhombus or a triangular shape. The top surface 58c may have the same area as the bottom surface 58a. Alternatively, the top surface 58c may have an area different than that of the bottom surface 58a. For example, the top surface 58c may be larger than the bottom surface 58a. Alternatively, the top surface 58c may be smaller than the bottom surface 58a. In an exemplary embodiment of the inventive concept, the top surface 58 may be disposed (e.g., extend) in a second longitudinal direction, different from the first longitudinal direction. The side surfaces 58b may be twisted from the first longitudinal direction to the second longitudinal direction. For example, the top surface 58c may have a top long axis 82 and a top short axis 84. The top long axis 82 may be longer than the top short axis 84. The top long axis 82 may be longer than the top short axis 84, for example, by about 1.5 times the length of the top short axis 84. The top long axis 82 might not be parallel to the bottom long axis 81. In an exemplary embodiment of the inventive concept, the top long axis 82 may be orthogonal to the bottom long axis 81. For example, the top long axis 82 and the bottom short axis 83 may be parallel to each other, and the top short axis 84 and the bottom long axis 81 may be parallel to each other.

Figure 4:
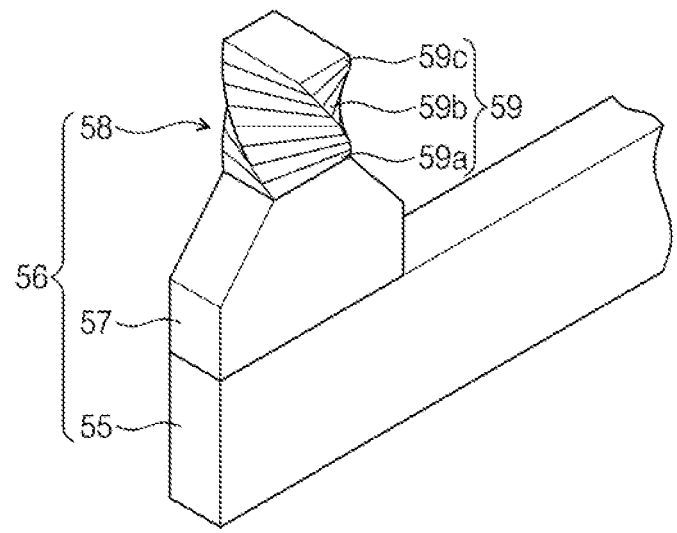
FIG. 4 is a perspective view illustrating a probe needle of the probe card of FIG. 2, according to an exemplary embodiment of the inventive concept.

FIG. 4 is a perspective view illustrating a probe needle of the probe card of FIG. 2, according to an exemplary embodiment of the inventive concept.

Referring to FIG. 4, the needle tip 58 may include a plurality of conductive layers 59. For example, each of the conductive layers 59 may have a rectangular parallelepiped shape. In an exemplary embodiment of the inventive concept, each of the conductive layers 59 may be a rectangle-shaped pattern. The conductive layers 59 may be stacked on each other and be rotated or twisted with respect to each other along the direction away from the needle base 57. In an exemplary embodiment of the inventive concept, the conductive layers 59 may include a lower conductive layer 59a, intermediate conductive layers 59b, and an upper conductive layer 59c. The lower conductive layer 59a may be in contact with the needle base 57. In an exemplary embodiment of the inventive concept, the lower conductive layer 59a may be disposed in the first longitudinal direction. The intermediate conductive layers 59b may be disposed between and connected to the lower conductive layer 59a and the upper conductive layer 59c. The upper conductive layer 59c may be disposed on the lower conductive layer 59a and the intermediate conductive layers 59b. In an exemplary embodiment of the inventive concept, the upper conductive layer 59c may be disposed in the second longitudinal direction. The intermediate conductive layers 59b may be disposed in third longitudinal directions. Each of the third longitudinal directions may form an angle with (e.g., cross) the first and second longitudinal directions. For example, the upper conductive layer 59c may be disposed to not be parallel with the lower conductive layer 59a. The needle body 55 may have the same structure as that of FIG. 3.

Figure 5:
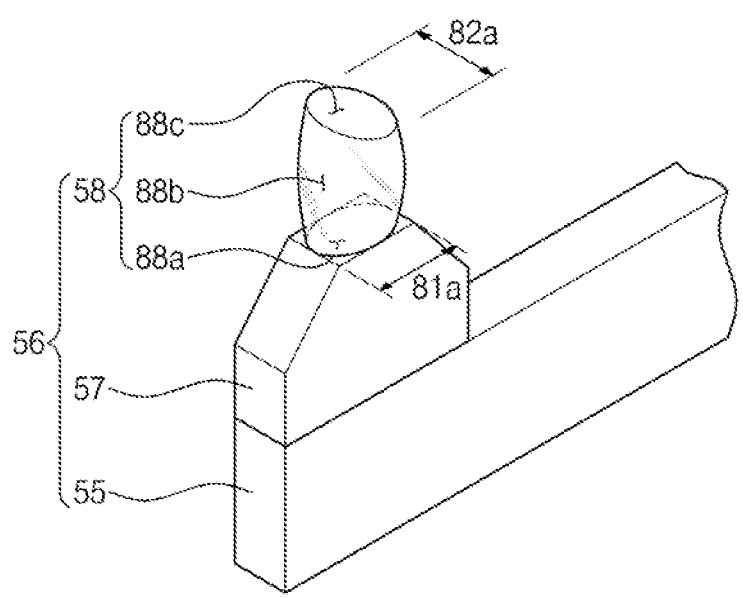
FIG. 5 is a perspective view illustrating a probe needle of the probe card of FIG. 2, according to an exemplary embodiment of the inventive concept.

FIG. 5 is a perspective view illustrating a probe needle of the probe card of FIG. 2, according to an exemplary embodiment of the inventive concept.

Referring to FIG. 5, the needle tip 58 may have a twisted elliptical pillar shape.

The needle tip 58 may have a bottom surface 88a, a top surface 88c, and a side surface 88b. Each of the bottom and top surfaces 88a and 88c of the needle tip 58 may have the shape of an ellipse. A side surface 88b may be provided between the bottom surface 88a and the top surface 88c and may have a twisted shape. The side surface 88b may be twisted and curved. The bottom long axis 81a and the top long axis 82a may be substantially orthogonal to each other. The needle body 55 and the needle base 57 may have the same structure as those of FIG. 3.

Figure 6:
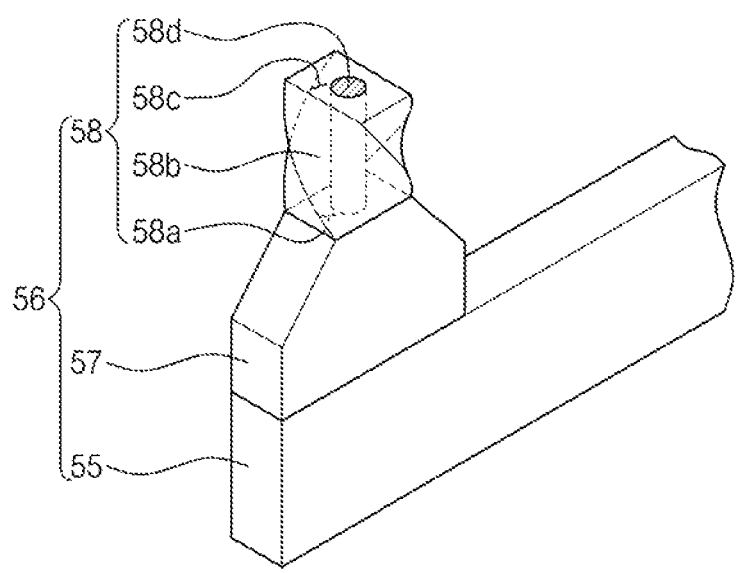
FIG. 6 is a perspective view illustrating a probe needle of the probe card of FIG. 2, according to an exemplary embodiment of the inventive concept.

FIG. 6 is a perspective view illustrating a probe needle of the probe card of FIG. 2, according to an exemplary embodiment of the inventive concept.

Referring to FIG. 6, the needle tip 58 may include a center pillar 58d. The center pillar 58d may extend from the bottom surface 58a to the top surface 58c. The center pillar 58d may be disposed at a center of the bottom surface 58a. The center pillar 58d may be disposed at a center of the top surface 58c. The needle body 55 and the needle base 57 may have the same structure as those of FIG. 3.

Referring back to FIGS. 1 to 3, the card monitoring part 70 may be used to monitor the heights 86 of the needle tip 58. This monitoring operation may increase the reliability of the probe card 50.

When a testing process is performed, the needle tip 58 may be in contact with the wafer W. As the testing process is repeated, the needle tip 58 may be gradually worn out. For example, the heights 86 of the needle tip 58 may be decreased as the testing process is repeated. This may lead to a reduction in an angle (e.g., see θ of FIG. 7) between the top and bottom surfaces 58c and 58a of the needle tip 58.

The control unit 74 of the card monitoring part 70 may be configured to detect the angle θ between the top and bottom surfaces 58c and 58a, based on a cumulative usage time of the probe card 50 and/or a cumulative time of the testing process. In addition, the control unit 74 may monitor the height 86 of the needle tip 58. For example, the control unit 74 may be configured to determine whether or not there is a failure associated with the heights 86 of the needle tips 58. In an exemplary embodiment of the inventive concept, the control unit 74 may be configured to measure or calculate the respective heights 86 of multiple needle tips 58.

Hereinafter, the failure-detection and the method of calculating the heights 86 of the multiple needle tips 58, which are performed in the card monitoring part 70, will be described with reference to the drawings.

Figure 7:
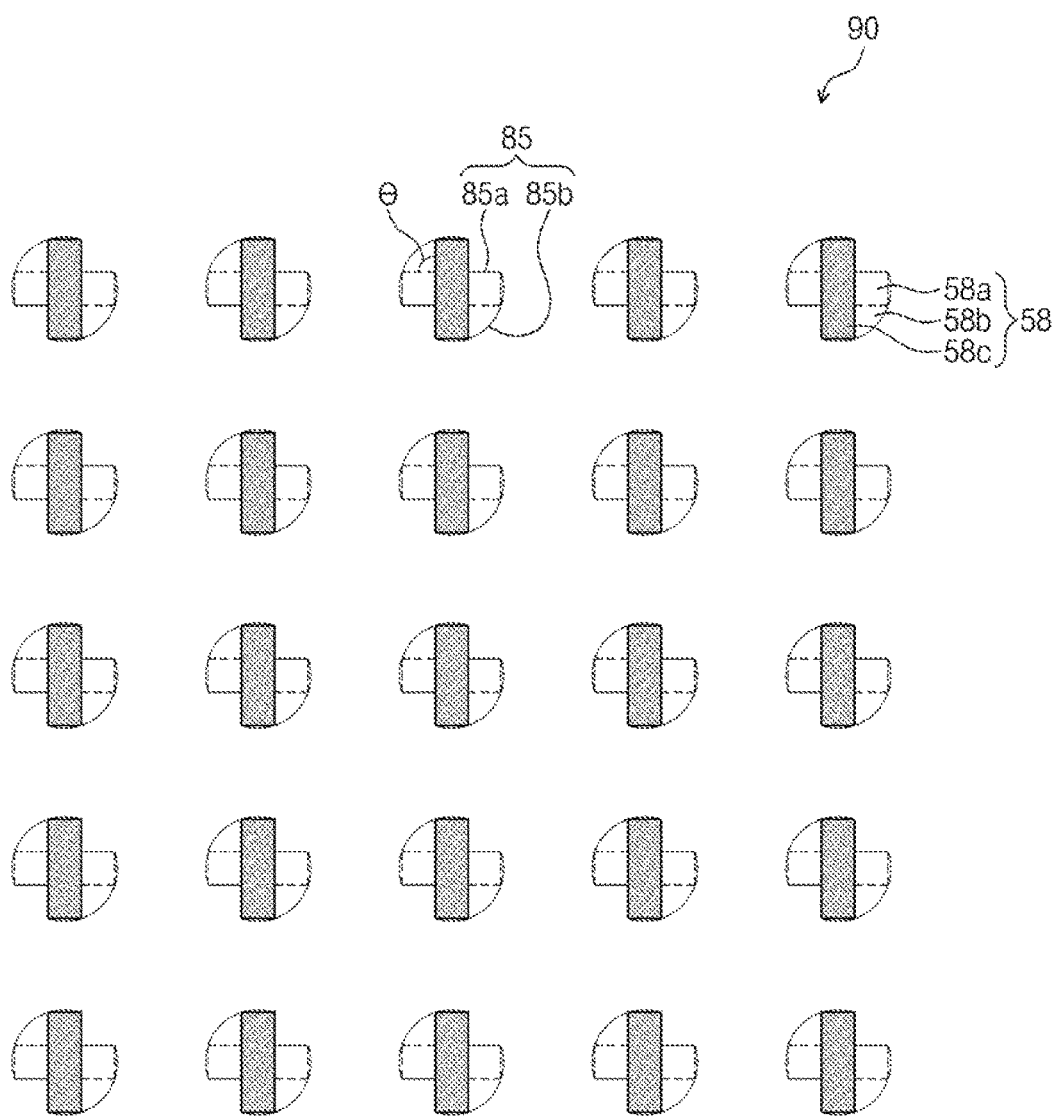
FIG. 7 is a plan view illustrating top surfaces of needle tips, according to an exemplary embodiment of the inventive concept.

FIG. 7 is a plan view illustrating the top surfaces 58c of multiple needle tips 58, according to an exemplary embodiment of the inventive concept. For example, FIG. 7 includes an image 90. The image 90 is a plan view of top surfaces 58c of the needle tips 58. The image 90 is taken (e.g., created) by the card monitoring part 70 of the testing apparatus 10 of FIG. 1, according to an exemplary embodiment of the inventive concept.

Referring to FIG. 7, the image 90 may be obtained to display the top surfaces 58c of the needle tips 58. For example, the top surfaces 58c may be displayed to have substantially the same longitudinal direction on the image 90. Contours 85 of the needle tips 58 may be displayed on the image 90. The contours 85 on the image 90 may be faintly displayed (e.g., are not as visible) in comparison with the top surfaces. In an exemplary embodiment of the inventive concept, the bottom and side surfaces 58a and 58b of the needle tips 58 may be illustrated using the contours 85. The bottom surfaces 58a may be oriented to have substantially the same longitudinal direction. Each of the contours 85 may include, for example, a contour 85a of the bottom surface 58a and a contour 85b of the side surface 58b. The contours 85a of the bottom surfaces 58a may be oriented to cross the top surfaces 58c. For example, the direction in which a surface 58a extends crosses the direction in which the top surface 58c of the same needle tip 58 extends. The contours 85a of the bottom surfaces 58a may be oriented to be substantially orthogonal to the top surfaces 58c. The top surfaces 58c may be oriented to be substantially orthogonal to the bottom surfaces 58a. For example, an angle θ between the top surfaces 58c and the bottom surfaces 58a may be about 90°. In an exemplary embodiment of the inventive concept, at least one of the contours 85a of the bottom surfaces 58a may be parallel to the top surfaces 58c. The contour 85b of the side surface 58b may connect the bottom surface 58a to the top surface 58c.

Figure 8:
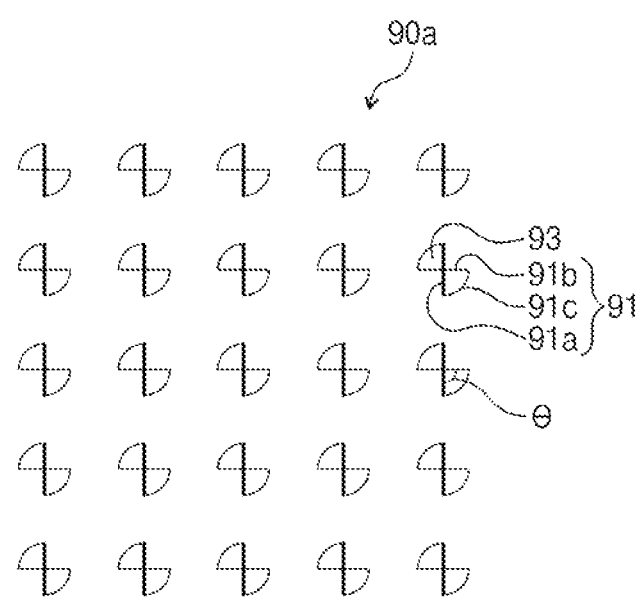
FIG. 8 is a reduced image of the top surfaces illustrated in FIG. 7, according to an exemplary embodiment of the inventive concept.

FIG. 8 is a reduced image 90a of the top surfaces 58c illustrated in FIG. 7, according to an exemplary embodiment of the inventive concept.

Referring to FIG. 8, the reduced image 90a may include first lines 91 and first internal regions 93.

The reduced image 90a may be the image 90 at low magnification. In the reduced image 90a, the top surfaces 58c and the contours 85 may be displayed as the first lines 91. For example, the first lines 91 may correspond to images of the top surfaces 58c and the contours 85 at the low magnification. Alternatively, the top surfaces 58c, the bottom surfaces 58a, and the side surfaces 58b may be displayed as the first lines 91. In an exemplary embodiment of the inventive concept, each of the first lines 91 may include first and second straight lines 91a and 91b and a first curved line 91c. The first straight lines 91a may correspond to the top surface 58c. The first straight lines 91a may be oriented to have substantially the same direction as the top surfaces 58c. The second straight lines 91b may correspond to the contours 85a of the bottom surfaces 58a. Alternatively, the second straight lines 91b may correspond to the bottom surfaces 58a. The second straight lines 91b may be oriented to cross the first straight lines 91a. For example, the first straight lines 91a may be orthogonal to the second straight lines 91b. The first curved lines 91c may correspond to the contours 85b of the side surfaces 58b. In an exemplary embodiment of the inventive concept, the first curved lines 91c between the first and second straight lines 91a and 91b may correspond to the angle θ between the first and second straight lines 91a and 91b.

The internal region 93 may be a closed region defined by the first and second straight lines 91a and 91b and the first curved line 91c. The internal region 93 may be a product of noise in the reduced image 90a. In an exemplary embodiment of the inventive concept, in the reduced image 90a, the internal region 93 may be removed.

Referring to FIGS. 1, 3, 7, and 8, the control unit 74 may be configured to determine whether the top surfaces 58c or the first lines 91 have the same shape and/or the same direction. In the case where the top surfaces 58c or the first lines 91 have the same shape and/or the same direction, the heights 86 of the needle tips 58 may be determined to be in a normal state. For example, the control unit 74 may be configured to determine whether the heights 86 of the needle tips 58 are in the normal state, based on comparison of the directions of the first straight lines 91a. In the case where, as shown in FIG. 8, the first straight lines 91a have the same direction, the heights 86 of the needle tips 58 may be determined to be in the normal state.

The control unit 74 may be configured to measure the angle θ between the top and bottom surfaces 58c and 58a, and to calculate the heights 86 of the needle tips 58 based on the measured angle θ. In the case where the top and bottom surfaces 58c and 58a are orthogonal to each other, the needle tips 58 may have the height 86 of, for example, about 30 µm. As an example, in the case where the angle θ between the top and bottom surfaces 58c and 58a is reduced by about 3°, the heights 86 of the needle tips 58 may be lowered by about 1 µm. In an exemplary embodiment of the inventive concept, the control unit 74 may be configured to measure an angle θ between the first and second straight lines 91a and 91b, and to calculate the heights 86 of the needle tips 58 based on the measured angle θ.

Figure 9:
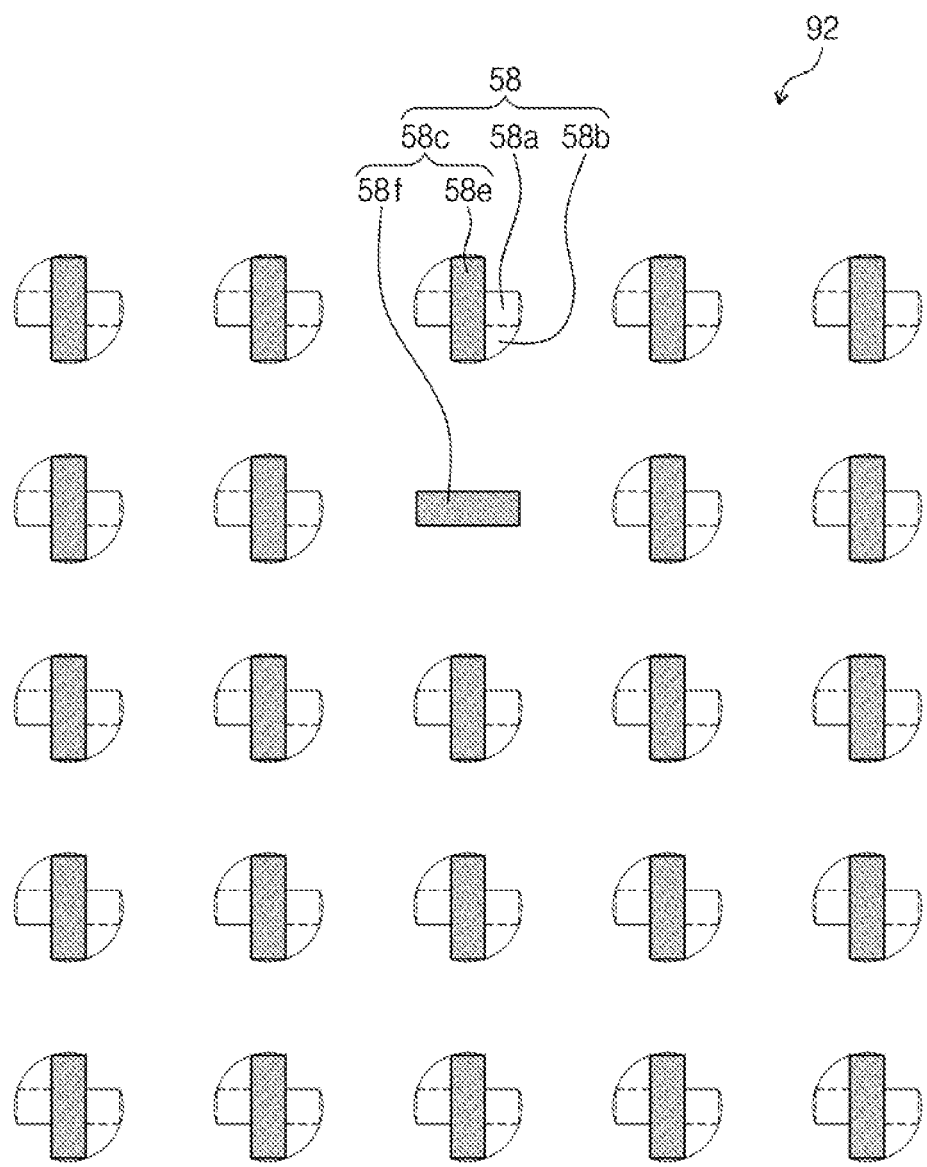
FIG. 9 illustrates an image which shows the existence of a failure in a height of a needle tip, according to an exemplary embodiment of the inventive concept.

FIG. 9 illustrates an image 92 which shows the existence of a failure in the height 86 of a needle tip 58, according to an exemplary embodiment of the inventive concept.

Referring to FIG. 9, the top surfaces 58c of the needle tips 58 may be oriented to have at least two different longitudinal directions. For example, the top surfaces 58c may include normal top surfaces 58e and an abnormal top surface 58f. The normal top surfaces 58e may be orthogonal to the bottom surfaces 58a. The side surfaces 58b may be displayed between the normal top surfaces 58e and the bottom surfaces 58a. For example, the abnormal top surface 58f may have the same longitudinal direction as the bottom surfaces 58a. In this case, the side surfaces 58b might not be displayed between the abnormal top surface 58f and the bottom surface 58a of the needle tip 58 having the abnormal top surface 58f. This may be so because the needle tip 58 having the abnormal top surface 58f may be fully consumed (e.g., the height 86 thereof may be zero). In an exemplary embodiment of the inventive concept, the side surfaces 58b of a first needle tip 58 may be displayed between an abnormal top surface 58f and the bottom surface 58a of the first needle tip 58. In this case, the first needle tip 58a having the abnormal top surface 58f might not be fully consumed.

Figure 10:
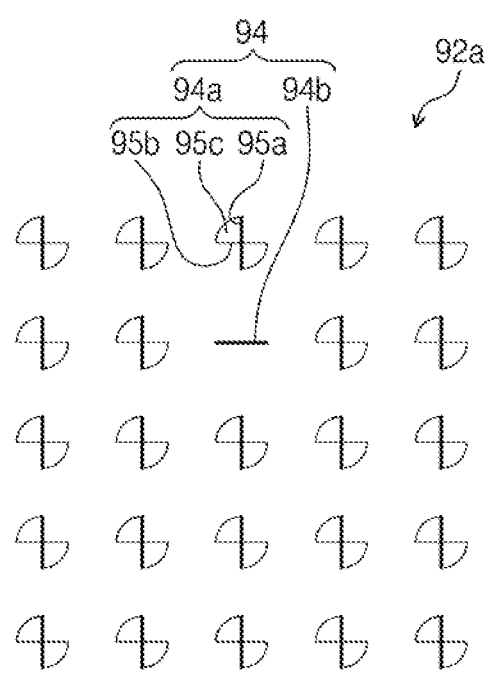
FIG. 10 is a reduced image of the top surfaces illustrated in FIG. 9, according to an exemplary embodiment of the inventive concept.

FIG. 10 is a reduced image 92a of the top surfaces 58c illustrated in FIG. 9, according to an exemplary embodiment of the inventive concept.

Referring to FIGS. 9 and 10, the reduced image 92a may include second lines 94. The second lines 94 may correspond to images of the top surfaces 58c, the bottom surfaces 58a, and the side surfaces 58b at low magnification. The second lines 94 may include normal lines 94a and an abnormal line 94b. Each of the normal lines 94a may correspond to the normal top surface 58e, the bottom surface 58a, and the side surfaces 58b at low magnification. For example, if the image 92 is displayed at the low magnification, the normal top surfaces 58e may be displayed as the normal lines 94a. In an exemplary embodiment of the inventive concept, each of the second lines 94 may include a first straight line 95a, a second straight line 95b, and a first curved line 95c. The first straight lines 95a may correspond to the normal top surfaces 58e at low magnification. The second straight lines 95b may correspond to the bottom surfaces 58a at low magnification. The first curved lines 95c may correspond to the side surfaces 58b. The abnormal line 94b may correspond to the abnormal top surface 58f at low magnification. The abnormal line 94b might not be parallel to the first straight lines 95a. For example, the abnormal line 94b may be parallel to the second straight lines 95b. The abnormal line 94b might not be connected to the first curved line 95c.

Referring to FIGS. 1, 3, 9, and 10, the control unit 74 may be configured to compare the normal lines 94a with the abnormal line 94b, and to determine whether there is a failure in the height 86 (hereinafter, height failure) of the needle tips 58 based on the comparison between the normal lines 94a and the abnormal line 94b. In the control unit 74, the abnormal line 94b may be regarded as the height failure. In the control unit 74, the abnormal line 94b in the reduced image 92a may be displayed or annotated as a height failure. For example, the control unit 74 may be connected to a display device, and the control unit 74 may cause the display device to show the height failure to a user and to annotate or indicate the height failure to the user for convenience of illustration. In the case where the needle tip 58 has the abnormal top surface 58f, its service life may have ended.

Figure 11:
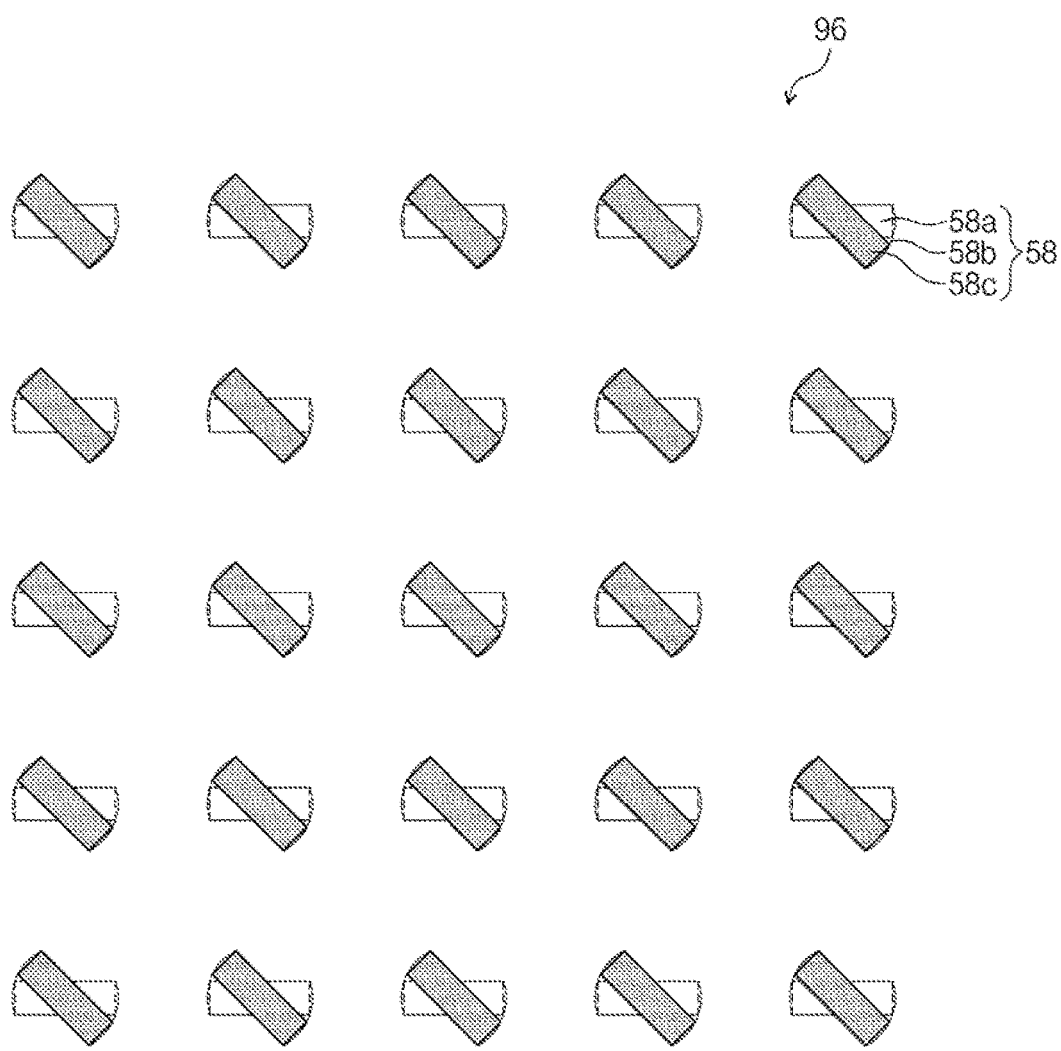
FIG. 11 is a plan view illustrating top surfaces of needle tips, as measured by a card monitoring part of FIG. 1, according to an exemplary embodiment of the inventive concept.

FIG. 11 is a plan view illustrating the top surfaces 58c of the needle tips 58, as measured by the card monitoring part 70 of FIG. 1, according to an exemplary embodiment of the inventive concept. For example, FIG. 11 is a plan view image 96 of the top surfaces 58c of the needle tips 58. The image 96 is acquired (e.g., created) by the card monitoring part 70 of the testing apparatus 10 of FIG. 1, according to an exemplary embodiment of the inventive concept.

Referring to FIG. 11, the image 96 may be obtained to display the bottom surface 58a and the top surface 58c crossing at an acute angle. For example, an angle between the bottom surface 58a and the top surface 58c may be about 45°.

Figure 12:
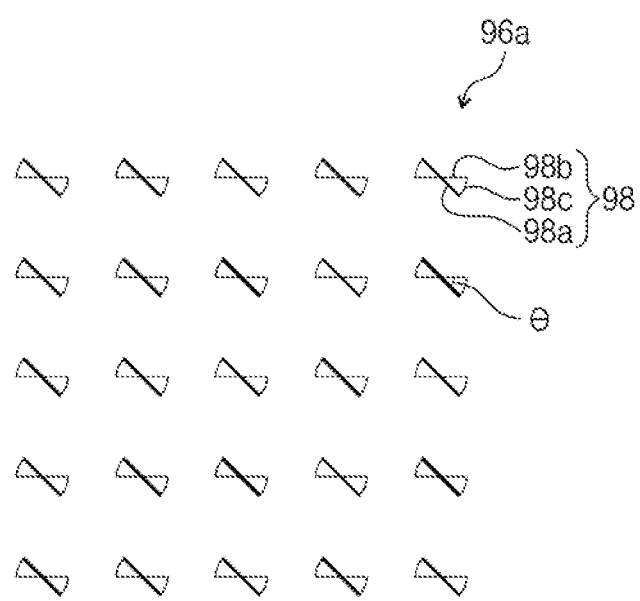
FIG. 12 is a reduced image of the top surfaces illustrated in FIG. 11, according to an exemplary embodiment of the inventive concept.

FIG. 12 is a reduced image 96a of the top surfaces 58c illustrated in FIG. 11, according to an exemplary embodiment of the inventive concept.

Referring to FIG. 12, the reduced image 96a may be obtained to display third lines 98. In the third lines 98, first straight lines 98a may cross second straight lines 98b at an acute angle θ. The first straight lines 98a may correspond to the top surfaces 58c. The second straight lines 98b may correspond to the bottom surfaces 58a. The angle θ between the first and second straight lines 98a and 98b may correspond to first curved lines 98c. For example, the angle θ between the first and second straight lines 98a and 98b may be about 45°.

Referring to FIGS. 1 to 3, 11, and 12, the control unit 74 may be configured to measure the angles θ between the first and second straight lines 98a, and 98b, and to calculate the heights 86 of the needle tips 58 based on the measured angles. The heights 86 of the needle tips 58 may decrease as the angle θ decreases. For example, in the case where the angles θ between the first and second straight lines 98a and 98b are decreased to a half of their initial value, the heights 86 of the needle tips 58, having the reduced-in-half angle θ, may have been decreased to a half of their initial magnitude. As an example, when the angle θ of a needle tip 58, having an initial height 86 of about 30 µm, is decreased from 90° to 45°, the height 86 of the needle tip 58 having the angle θ of 45° has been decreased to about 15 µm.

Figure 13:
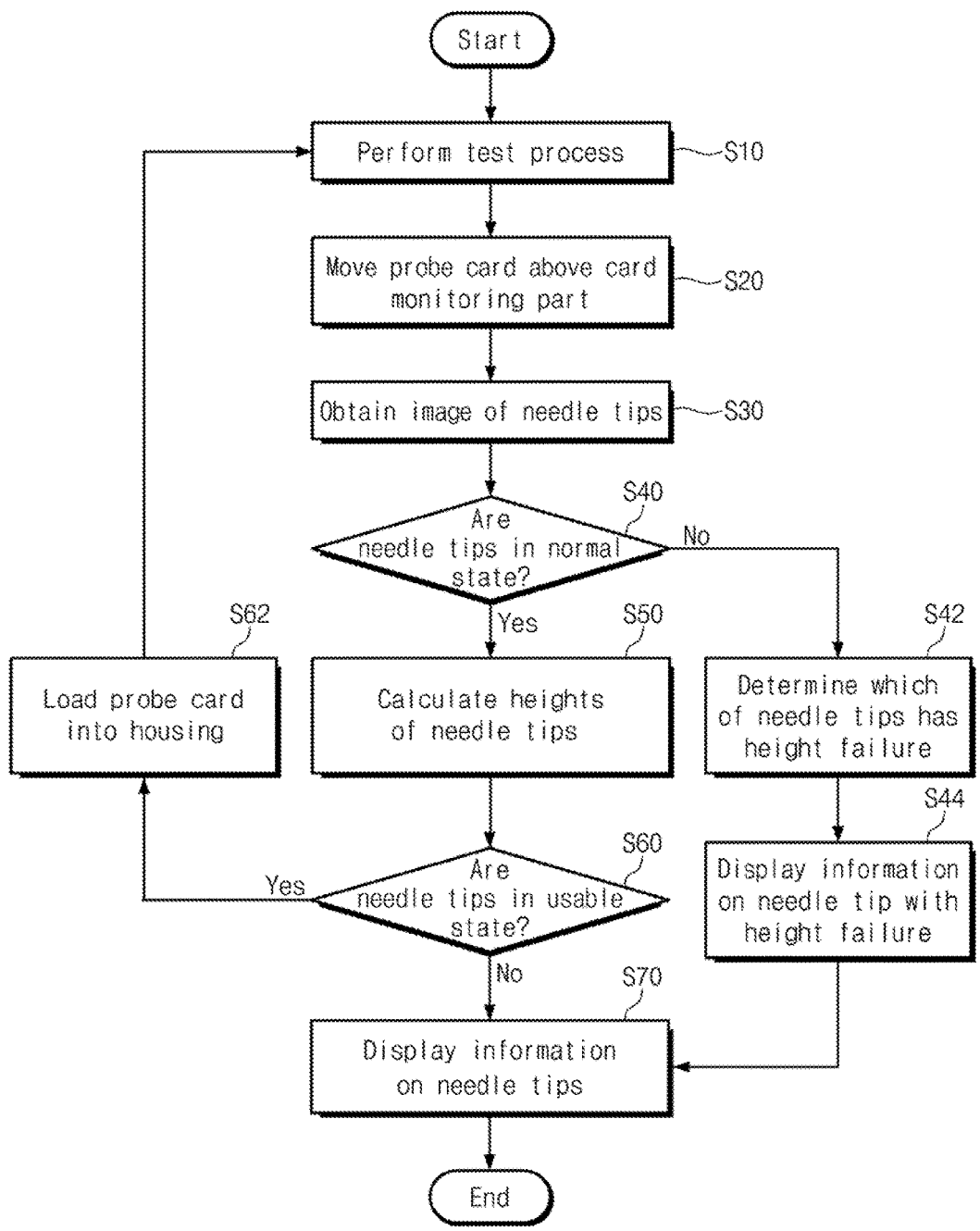
FIG. 13 is a flowchart illustrating a testing method which may be performed using the testing apparatus of FIG. 1, according to an exemplary embodiment of the inventive concept.

FIG. 13 is a flowchart illustrating a testing method which may be performed using the testing apparatus of FIG. 1, according to an exemplary embodiment of the inventive concept.

Referring to FIGS. 1 and 13, the testing apparatus 10 may be configured to perform a testing process (in S10).

The card transferring part 60 may be configured to change a position of the probe card 50 (e.g., on a region above the sensor 72 of the card monitoring part 70) (in S20). The probe card 50 may be transferred to the region above the card monitoring part 70, based on a cumulative usage time.

Referring to FIGS. 1 to 3, 7 to 10, and 13, the sensor 72 of the control unit 74 may be used to obtain the image 90 of the needle tips 58 (in S30).

The control unit 74 may be configured to determine longitudinal directions of the top surfaces 58c of the image 90 and determine whether the needle tips 58 are in a normal state (in S40). In the case where there is a height failure of the needle tips 58, the control unit 74 may determine which of the needle tips 58 has the height failure (in S42). The needle tip 58 with the height failure may have the abnormal top surface 58f. The control unit 74 may control a display device to display the needle tip 58 with the height failure as a failed needle tip (in S44) For example, the control unit 74 may cause an image of the needle tip 58 with the height failure to be displayed on a display device and the control unit 74 may annotate the needle tip 58 with the height failure on the display device for convenience of a user (in S44). Thereafter, the card transferring part 60 may eject the probe card 50 from the testing apparatus 10. An operator may replace the failed needle tip with a new one.

Referring to FIGS. 1, 3, 7, 8, and 13, when all of the needle tips 58 are in a normal state, the heights 86 of the needle tips 58 may be calculated by the control unit 74 (in S50). The heights 86 of the needle tips 58 may be calculated based on an angle θ between the top and bottom surfaces 58c and 58a. In an exemplary embodiment of the inventive concept, the heights 86 of the needle tips 58 may be calculated based on an angle θ between the first and second straight lines 91a and 91b.

The control unit 74 may determine whether the needle tips 58 are in a usable state (in S60).

For example, if the needle tips 58 have the heights 86 of about 8 μm or less, the testing process may have a low reliability. Needle tips 86 having heights 86 of about 8 μm should not be used in the testing process. When the heights 86 of the needle tips 58 are greater than about 8 μm, the needle tips 58 may be used in the testing process.

In the case where the needle tips 58 are in the usable state, the probe card 50 may be loaded into the prober 20 by the card transferring part 60 (in S62). In the case where the needle tips 58 are not in the usable state, the control unit 74 may control the display device to display the fact that at least one of the needle tips 58 should be replaced with a new one (in S70). Then, the testing process may be terminated.

According to an exemplary embodiment of the inventive concept, a probe card may include at least one needle, whose side surface connecting top and bottom surfaces has a twisted structure. In this case, when a needle tip is consumed, an angle between the top and bottom surface may be changed. For example, by measuring the angle between the top and bottom surfaces of the needle tip, a height of the needle tip may be determined and monitored to increase reliability of the probe card.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A probe card, comprising:
   a probe board; and
   a needle disposed on the probe board, the needle comprising a needle tip,
   wherein the needle tip comprises:
      a bottom surface having a long axis and a short axis that crosses the long axis;
      a top surface being spaced apart from the bottom surface, wherein the top surface has a long axis and a short axis that crosses the long axis, and wherein the long axis of the bottom surface and the long axis of the top surface extend in different directions;
      a side surface connecting the bottom surface with the top surface, wherein the side surface is twisted between the top and bottom surfaces; and
   cross-sectional surfaces between the top surface and the bottom surface of the needle tip, wherein the cross-sectional surfaces have long axes between the long axis of the top surface and the long axis of the bottom surface, wherein the needle tip comprises conductive layers stacked on the probe board, and
   the conductive layers comprise:
      a lower conductive layer having a long axis and a short axis that crosses the long axis;
      an upper conductive layer being spaced apart from the lower conductive layer, wherein the upper conductive layer has a long axis and a short axis that crosses the long axis; and
      a plurality of intermediate conductive layers disposed between the upper and lower conductive layers, wherein each of the plurality of intermediate conductive layers has a long axis and a short axis that crosses the long axis, and wherein the long axis of each of the plurality of intermediate conductive layers extends in a direction different from that of the long axis of the lower conductive layer or the long axis of the upper conductive layer.

2. The probe card of claim 1, wherein the needle tip has a twisted rectangular parallelepiped structure.

3. The probe card of claim 1, wherein the needle tip is a twisted elliptical pillar.

4. The probe card of claim 1, wherein the needle tip further comprises a center pillar extending from a center of the top surface to a center of the bottom surface.

5. The probe card of claim 1, wherein the top and bottom surfaces have a same shape.

6. The probe card of claim 1, wherein an angle between the long axis of the top surface and the long axis of the bottom surface is indicative of a level of a height of the needle tip.

7. The probe card of claim 1, wherein the needle further comprises:
   a needle body disposed between the probe board and the needle tip; and
   a needle base disposed between the needle body and the needle tip.

8. The probe card of claim 1, wherein the probe board comprises:
   a printed circuit board;
   an insulation board disposed on the printed circuit board; and
   an interposer disposed between the insulation board and the printed circuit board.

9. The probe card of claim 1, wherein the long axes of the cross-sectional surfaces rotate from the long axis of the bottom surface to the long axis of the top surface.

10. The probe card of claim 1, wherein the long axes of the cross-sectional surfaces rotate in a clockwise direction from the long axis of the bottom surface to the long axis of the top surface.

11. The probe card of claim 1, wherein the needle tip is a single body.

12. A testing apparatus, comprising:
   a wafer supporting part configured to receive a wafer thereon;
   a probe card configured to provide electrical paths to the wafer; and a tester configured to electrically test the wafer through the probe card, wherein the probe card comprises:
a probe board; and
a needle disposed on the probe board, wherein the needle comprises a needle tip,
wherein the needle tip comprises:
a bottom surface including a first axis and a second axis that crosses the first axis;
a top surface being spaced apart from the bottom surface, wherein the top surface includes a first axis and a second axis that crosses the first axis, and wherein the first axis of the bottom surface and the first axis of the top surface extend in different directions;
a side surface connecting the bottom surface with the top surface, wherein the side surface is twisted; and
cross-sectional surfaces between the top surface and the bottom surface of the needle tip, wherein the cross-sectional surfaces have long axes between the long axis of the top surface and the long axis of the bottom surface, wherein the needle tip comprises conductive layers stacked on the probe board, and
the conductive layers comprise:
a lower conductive layer having a long axis and a short axis that crosses the long axis;
an upper conductive layer being spaced apart from the lower conductive layer, wherein the upper conductive layer has a long axis and a short axis that crosses the long axis; and
a plurality of intermediate conductive layers disposed between the upper and lower conductive layers, wherein each of the plurality of intermediate conductive layers has a long axis and a short axis that crosses the long axis, and wherein the long axis of each of the plurality of intermediate conductive layers extends in a direction different from that of the long axis of the lower conductive layer or the long axis of the upper conductive layer.

13. The testing apparatus of claim 12, further comprising a needle monitoring part configured to monitor a height of the needle tip.

14. The testing apparatus of claim 13, wherein the needle monitoring part comprises:
a sensor configured to acquire an image of the needle tip; and
a control unit configured to determine the different directions in which the first axis of the bottom surface and the first axis of the top surface extend using the acquired image of the needle tip, and wherein the control unit is configured to determine the height of the needle tip.

15. The testing apparatus of claim 14, wherein the control unit determines the height of the needle tip based on an angle between the different directions in which the first axis of the bottom surface and the first axis of the top surface extend.

16. The testing apparatus of claim 13, further comprising a transferring part configured to transfer the probe card into a region above the needle monitoring part.

17. A probe card, comprising:
a probe board; and
a needle comprising:
a needle tip including a bottom surface on the probe board, top surface opposite the bottom surface and cross-sectional surfaces between the top surface and the bottom surface of the needle tip,
wherein the needle tip extends in a first direction, and the needle tip is twisted along the first direction from the bottom surface to the top surface,
wherein the bottom surface has a first long axis and a first short axis,
wherein the top surface has a second long axis different the first long axis and a second short axis different the first short axis, and
wherein the cross-sectional surfaces have a third long axis between the first and second long axes, and a third short axis between the first and second short axes, wherein the needle tip comprises conductive layers stacked on the probe board, and
the conductive layers comprise:
a lower conductive layer having a long axis and a short axis that crosses the long axis;
an upper conductive layer being spaced apart from the lower conductive layer, wherein the upper conductive layer has a long axis and a short axis that crosses the long axis; and
a plurality of intermediate conductive layers disposed between the upper and lower conductive layers, wherein each of the plurality of intermediate conductive layers has a long axis and a short axis that crosses the long axis, and wherein the long axis of each of the plurality of intermediate conductive layers extends in a direction different from that of the long axis of the lower conductive layer or the long axis of the upper conductive layer.

18. A testing apparatus, comprising:
a wafer supporting part configured to receive a wafer thereon;
the probe card of claim 17, wherein the probe card is configured to provide electrical paths to the wafer; and
a tester configured to electrically test the wafer using the probe card,
wherein the needle tip comprises:
a twisted side surface connecting the bottom surface with the top surface, wherein the top surface is spaced apart from the bottom surface along the first direction and is rotated laterally with respect to the bottom surface.

19. The testing apparatus of claim 18, further comprising a needle monitoring part configured to determine a height of the needle tip,
wherein the needle monitoring part comprises:
a sensor configured to acquire an image of the needle tip; and
a control unit configured to determine an angle of rotation between the top and bottom surfaces using the acquired image.

* * * * *